(12) United States Patent
Ma et al.

(10) Patent No.: US 7,253,492 B2
(45) Date of Patent: Aug. 7, 2007

(54) SEMICONDUCTOR STRUCTURE WITH VIA STRUCTURE

(75) Inventors: Gordon Ma, Phoenix, AZ (US); Carsten Ahrens, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/531,507

(22) Filed: Sep. 13, 2006

(65) Prior Publication Data
US 2007/0007616 A1   Jan. 11, 2007

Related U.S. Application Data

(62) Division of application No. 10/789,478, filed on Feb. 27, 2004, now abandoned.

(51) Int. Cl.
*H01L 29/00* (2006.01)
(52) U.S. Cl. .............. 257/502; 257/758; 257/E23.145
(58) Field of Classification Search .............. 257/502, 257/503, 758, E23.145
See application file for complete search history.

(56) References Cited

U.S. PATENT DOCUMENTS

| | | | |
|---|---|---|---|
| 4,811,075 A | 3/1989 | Eklund | 357/46 |
| 5,151,770 A | 9/1992 | Inoue | 357/53 |
| 5,155,563 A | 10/1992 | Davies et al. | 357/23.4 |
| 5,252,848 A | 10/1993 | Adler et al. | 257/328 |
| 5,313,082 A | 5/1994 | Eklund | 257/262 |
| 5,767,578 A | 6/1998 | Chang et al. | 257/717 |
| 6,168,983 B1 | 1/2001 | Rumennik et al. | 438/188 |
| 6,472,723 B1 | 10/2002 | Jarstad et al. | 257/659 |
| 6,563,171 B2 | 5/2003 | Disney | 257/342 |

FOREIGN PATENT DOCUMENTS

| | | |
|---|---|---|
| DE | 19640246 A1 | 4/1998 |
| EP | 0847083 A2 | 6/1998 |
| JP | 06342978 | 12/1994 |
| JP | 2000269429 | 9/2000 |

OTHER PUBLICATIONS

J.A. Appels and H.M.J. Vaes, "High voltage thin layer devices (RESURF devices)", IEDM technical digest, pp. 238-241, 1979.
H.M.J. Vaes and J.A. Appels, "High voltage high current lateral devices", IEDM technical digest, pp. 87-90, 1980.

(Continued)

Primary Examiner—Phat X. Cao
(74) Attorney, Agent, or Firm—Baker Botts L.L.P.

(57) ABSTRACT

A semiconductor device may comprise a semiconductor substrate having a top and a bottom surface, first and second insulating layer deposited on the top surface of the substrate, a runner arranged on top of the second insulator layer, a backside metal layer deposited on the bottom surface of the substrate, a first via structure extending from the bottom surface of the substrate to the top of the first insulating layer between the backside layer and the runner, and a second via extending from the top of the first insulating layer to the top of the second insulating layer between the first via and the runner.

42 Claims, 10 Drawing Sheets

OTHER PUBLICATIONS

T. Fujihira, "Theory of Semiconductor Superjunction Devices", Jpn. J. Appl. Phys., vol. 36, pp. pp. 6254-6262, 1997.

G. Deboy, et al., "A new generation of high voltage MOSFETs breaks the limit line of silicon", IEDM technical digest, pp. 683-685, 1998.

A. Ludikhuize, "A review of RESURF technology", Proc. of ISPSD, p. 11, 2000.

J. Cai, et al., A novel high performance stacked LDD RF LDMOSFET, IEEE Electron Device Lett., vol. 22, No. 5, pp. 236-238, 2001.

J.G. Mena and C.A.T. Salama, "High voltage multiple-resistivity Drift-Region LDMOS", Solid State Electronics, vol. 29, No. 6, pp. 647-656, 1986.

M.D. Pocha and R.W. Dutton, "A computer-aided design model for High-Voltage Double Diffused MOS (DMOS) Transistors", IEEE Journal of Solid-State Circuits, vol. SC-11, No. 5, 1976.

I. Yoshia, et al.; "Highly Efficient 1.5 GHz Si Power MOSFET for Digital Cellular Front End"; Proceedings of International Symposium on Power Semiconductor Devices & ICs; Tokyo, pp. 156-157, 1992.

Helmut Brech et al; "Record Efficiency and Gain at 2.1 GHz of Hih Power RF Transistors for Cellular and 3G Base Stations"; RF & DSP INfrastructure Devision, Semiconductor Products Sector, Motorola, Tempe, Arizona, 2003.

International Search Report and Written Opinion, PCT/EP2005/001952, 12 pages, mailing date Jan. 9, 2005.

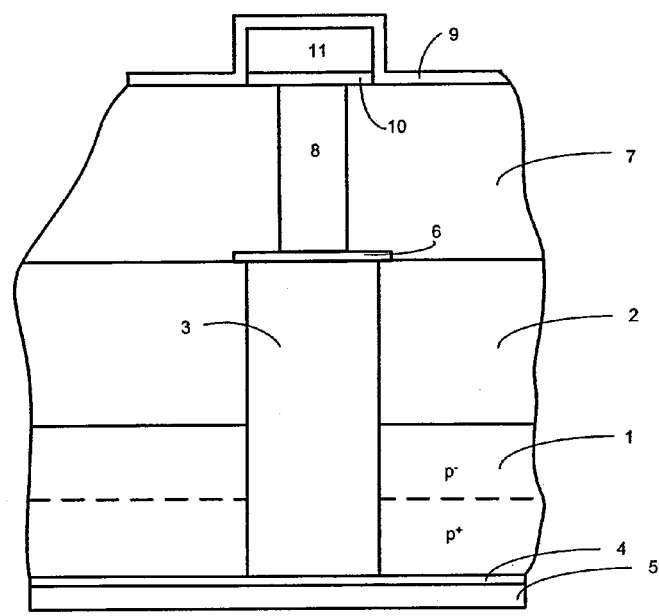
FIG. 1
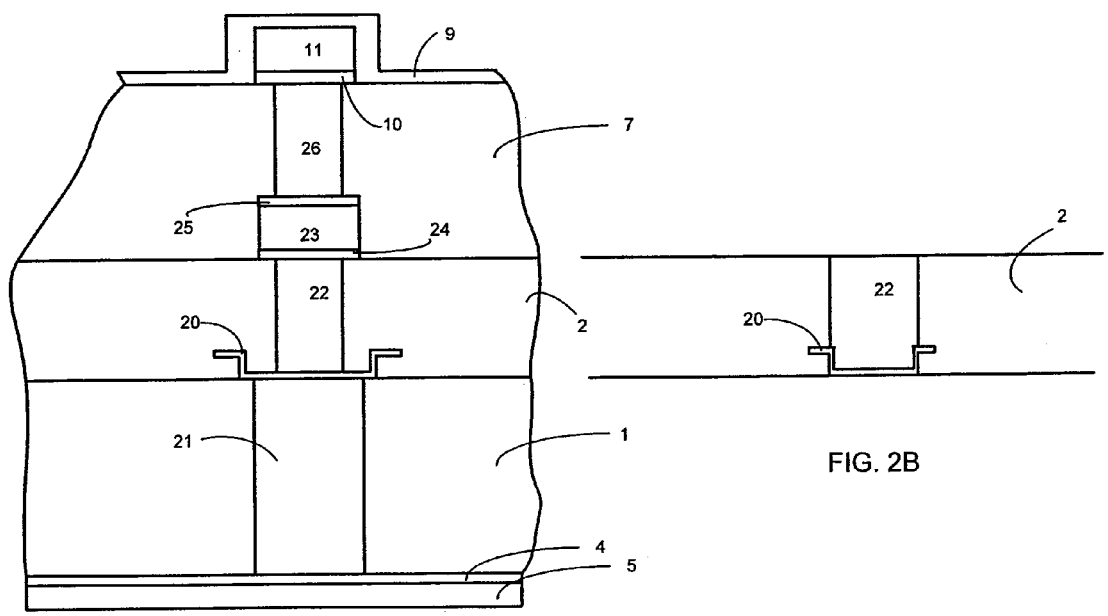
FIG. 2A
FIG. 2B

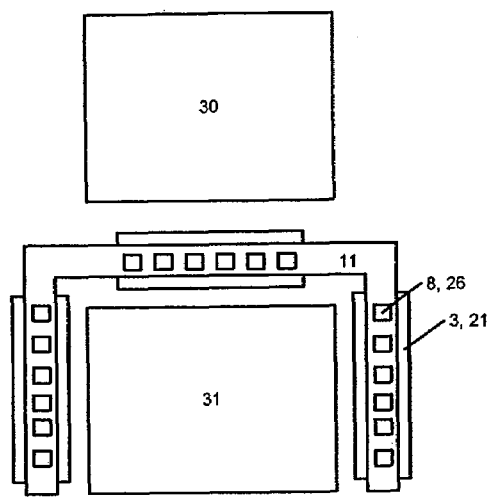
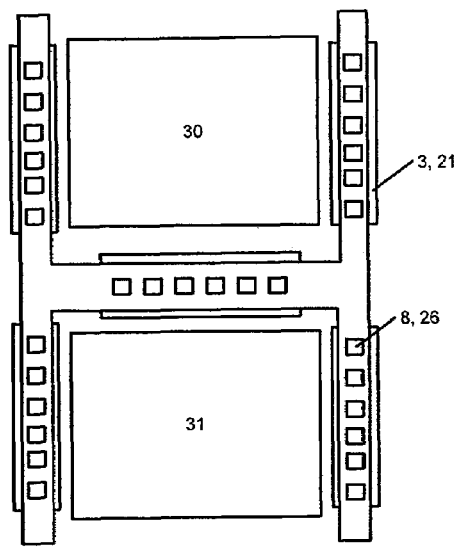
FIG. 12A
FIG. 12B
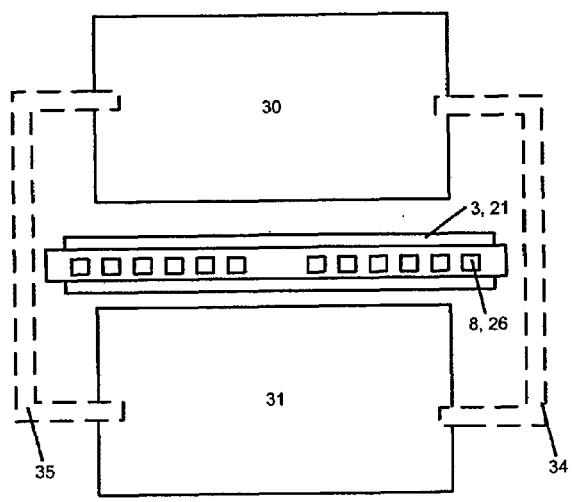
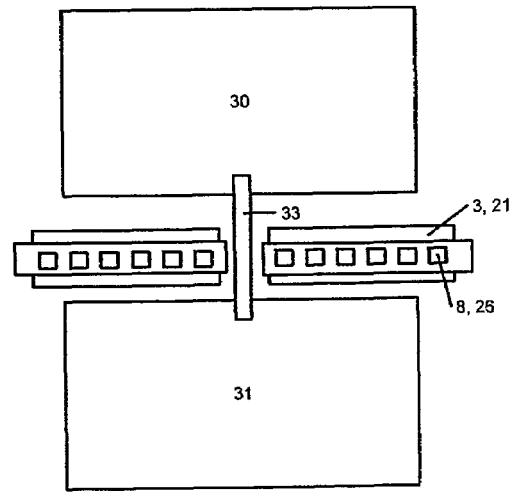
FIG. 12C
FIG. 12D

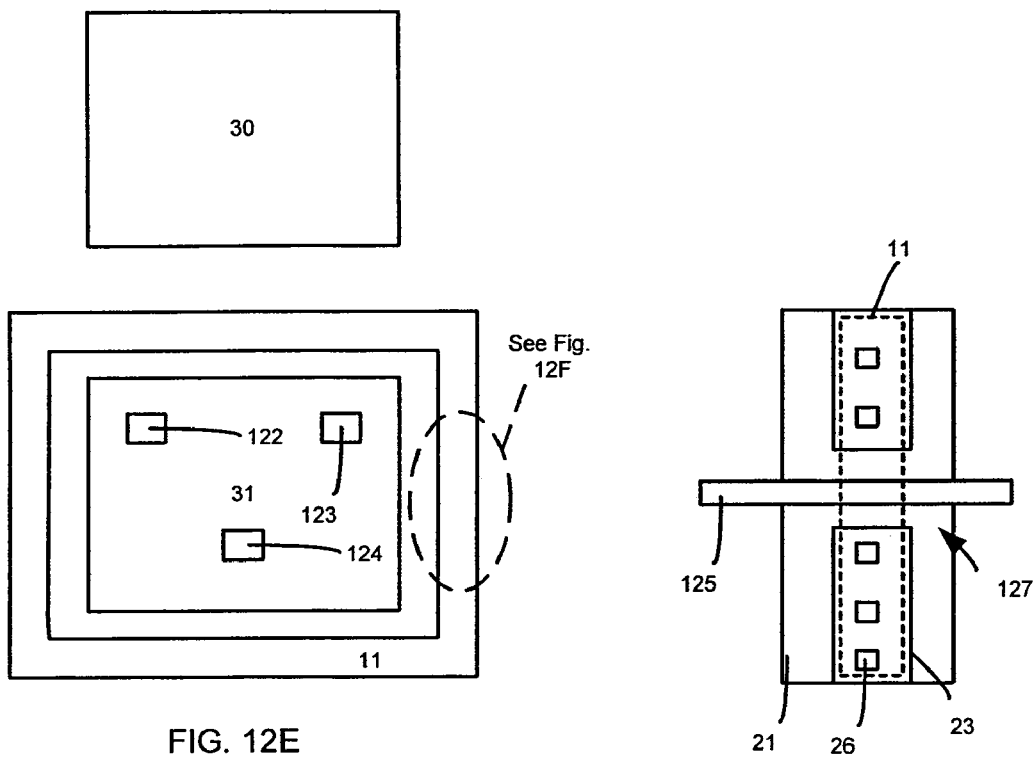
FIG. 12E
FIG. 12F
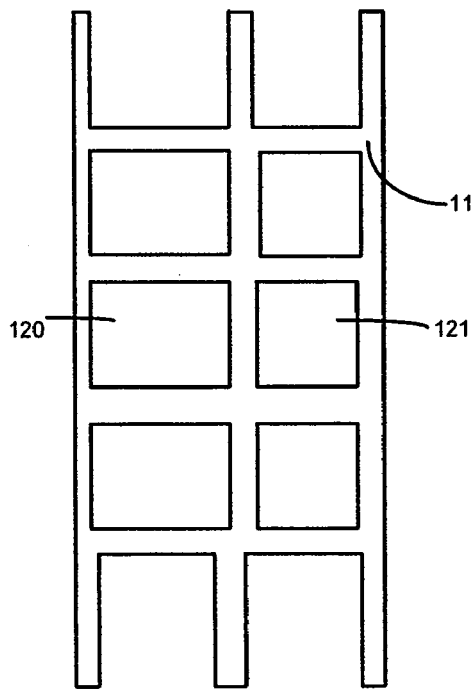
FIG. 12G

SEMICONDUCTOR STRUCTURE WITH VIA STRUCTURE

PRIORITY

This application is a divisional of U.S. patent application Ser. No. 10/789,478 filed Feb. 27, 2004, abandoned, the contents of which is hereby incorporated in its entirety by reference.

FIELD OF THE INVENTION

The present application relates to a semiconductor structure.

BACKGROUND OF THE INVENTION

Semiconductor devices, such as high power semiconductors or integrated semiconductors comprising at least one power device, often require good isolation between certain integrated devices to suppress electrical and/or magnetic interference. Furthermore thermal conductive paths are often needed to reduce the operating temperature of active devices and decouple the heat dissipation from an output stage to the input stage. No solution is known that effectively improves the components electrical and thermal conductivity and at the same time decouples electrical, magnetic, and thermal interference between components at the same time.

SUMMARY OF THE INVENTION

According to the present application, a semiconductor structure is introduced. Such a semiconductor device may comprise a semiconductor substrate having a top and a bottom surface, first and second insulating layer deposited on the top surface of the substrate, a runner arranged on top of the second insulator layer, a backside metal layer deposited on the bottom surface of the substrate, a first via structure extending from the bottom surface of the substrate to the top of the first insulating layer between the backside layer and the runner, and a second via extending from the top of the first insulating layer to the top of the second insulating layer between the first via and the runner.

The device may further comprise barrier metal layers arranged between the first and second via, between the runner and the second via, and between the first via and the backside metal layer. The second via may have a smaller footprint than the first via and a plurality of second vias are arranged between the first via and the runner. The barrier metal layer between the first and second via can have a cross-sectional profile of a saucer. The bottom barrier metal layer may comprise side walls that enclose the via. The barrier metal layer between the first via and the second via may comprise side walls that are spaced apart from the via. The barrier metal layer between the first via and the second via can consist of Titanium-Titanium nitride. The barrier metal layer between the runner and the second via and the barrier metal layer between the backside layer and the first via can consist of Titanium-Platinum. The second via may be filled with tungsten. The first via can be filled with Tungsten or copper. The substrate may comprise a p+ substrate and p− epitaxial layer. First and second via structures can be arranged between a first and second stage of an integrated device for electromagnetic and/or thermal de-coupling. The first stage can be an input transistor stage and the second stage can be a power transistor output stage. The first and second via structures can be extended in such a way that they at least partly surround a device formed within the semiconductor device for electromagnetic and/or thermal de-coupling. The first and optionally the second via structures can be extended in such a way that they at completely surround the device. The first and second via structures can be extended to form a grid including cells in which certain semiconductor devices are formed. The device may include an active semiconductor structure and/or includes a passive semiconductor structure. A first device can be shielded from a second device and the first device can be coupled with the second device through at least one electrical coupling. The second via structure may comprise an opening for providing a passageway for the electrical coupling. The electrical coupling can be arranged in a first or second metal layer. The first and second via structures can also be arranged within a field effect transistor structure having a source region, a drain region and a gate, in such a way that the first via couples the source region with the backside layer. The device may further comprise at least one drain runner arranged on top of the first and/or second oxide layer above the drain region and on one side of the first and second via structures, and at least one gate runner arranged on top of the first and/or second oxide layer on the other side of the first and second via structures.

In another exemplary embodiment, a semiconductor device may comprise a semiconductor substrate having a top and a bottom surface, first and second insulating layer deposited on the top surface of the substrate, a first runner arranged on top of the first insulator layer, a second runner arranged on top of the second insulator layer above the first runner, a backside metal layer deposited on the bottom surface of the substrate, a first via structure extending from the bottom surface of the substrate to the top surface of the substrate between the backside layer and the first runner, a second via structure extending from the top surface of the substrate to the top of the first insulating layer between the first via and the first runner, and a third via extending from the top of the first insulating layer to the top of the second insulating layer between the first runner and the second runner.

The device may further comprise barrier metal layers arranged between the first and second via, between the first runner and the second via, between the first runner and the third via, between the third via and the second runner and between the first via and the backside metal layer. The second and third vias may have a smaller footprint than the first via and a plurality of second and third vias can be arranged between the first via and the runner. The barrier metal layer between the first and second via may have a cross-sectional profile of a saucer. The bottom barrier metal layer may comprise side walls that enclose the via. The barrier metal layer between the first via and the second via may comprise side walls that are spaced apart from the via. The barrier metal layers between the first via and the second via, between the first runner and the second via, and between the third via and the first runner may consist of Titanium-Titanium nitride. The barrier metal layers between the second runner and the third via and between the backside layer and the first via may consist of Titanium-Platinum. The second and third vias can be filled with tungsten. The first via can be filled with Tungsten or copper. The substrate may comprise a p+ substrate and p− epitaxial layer. First, second and third via structures can be arranged between a first and second stage of an integrated device for electromagnetic and/or thermal de-coupling. The first stage can be an input transistor stage and the second stage can be a power transistor output stage. The first and optionally the second and third via structures can be extended in such a way that they at least partly surround a device formed within the semiconductor device for electromagnetic and/or thermal decoupling. The first, second and third via structures can be extended in such a way that they at completely surround the device. The first, second and third via structures can be extended to form a grid including cells in which certain semiconductor devices are formed. The device may include an active semiconductor structure and/or a passive semiconductor structure. A first device can be shielded from a second device and the first device can be coupled with the second device through at least one electrical coupling. The second and/or third via structure may comprise an opening for providing a passageway for the electrical coupling. The electrical coupling can be arranged in a first or second metal layer. The first, second and third via structures can be arranged within a field effect transistor structure having a source region, a drain region and a gate, in such a way that the first via couples the source region with the backside layer. The device may further comprise at least one drain runner arranged on top of the first and/or second oxide layer above the drain region and on one side of the first and second via structures, and at least one gate runner arranged on top of the first and/or second oxide layer on the other side of the first, second and third via structures.

An exemplary method for manufacturing a semiconductor device may comprise the steps of:
 providing a substrate,
 depositing an first insulating layer on top of the substrate,
 forming at least one window structure on top of the insulating layer,
 etching a first via within the substrate and through the insulating layer,
 filling the via with a metal,
 depositing a second insulating layer on top of the substrate,
 etching a second via within the second insulating layer on top of the first via,
 filling the second via with metal,
 planarizing the surface,
 depositing a runner structure on top of the vias on the surface.

The method may further comprise the step of depositing a first barrier metal layer between the first via and the second via. The method may further comprise the step of depositing a second barrier metal layer between the second via and the runner. The first barrier metal layer may have the cross-sectional profile of a saucer by overlapping the edges of the window. The second barrier metal layer may consist of Titanium-Platinum. The first barrier metal layer may consist of Titanium-Titanium nitride. The first via can be filled with copper or tungsten. The second via can be filled with tungsten. The method may further comprise the steps of grinding the bottom surface of the substrate to expose the metal within the via, and depositing a backside metal layer on the bottom surface of the substrate. The step of depositing the backside metal layer may include the steps of first depositing a metal barrier layer and then depositing a metal layer on top of the metal barrier layer.

Also, another exemplary method for manufacturing a semiconductor device may comprise the steps of:
 providing a substrate,
 forming at least one window structure on top of the substrate,
 etching a first via within the substrate,
 filling the via with a metal,
 depositing an first insulating layer on top of the substrate,
 forming at least one window structure on top of the first insulating layer,
 etching a second via through the insulating layer,
 filling the second via with a metal,
 depositing a first runner structure on top of the second via,
 depositing a second insulating layer on top of the substrate,
 forming at least one window structure on top of the second insulating layer,
 etching a third via within the second insulating layer on top of the second via,
 filling the third via with metal,
 planarizing the surface,
 depositing a second runner structure on top of the stacked vias on the surface.

The method may further comprise the step of depositing a first barrier metal layer between the first via and the second via. The method may also further comprise the step of depositing a second barrier metal layer between the second via and the first runner, a third barrier metal layer between the first runner and the third via, and a fourth barrier metal layer between the third via and the second runner. The first barrier metal layer may have the cross-sectional profile of a saucer by overlapping the edges of the window. The first, second and third barrier metal layers may consist of Titanium-Titanium nitride and the fourth barrier metal layer consists of Titanium-Platinum. The first via can be filled with copper or tungsten. The second and third vias can be filled with tungsten. The method may further comprise the steps of grinding the bottom surface of the substrate to expose the metal within the first via, and depositing a backside metal layer on the bottom surface of the substrate. The step of depositing the backside metal layer may include the steps of first depositing a metal barrier layer and then depositing a metal layer on top of the metal barrier layer. The backside metal barrier layer may consists of Titanium-Platinum.

Other technical advantages of the present disclosure will be readily apparent to one skilled in the art from the following figures, descriptions, and claims. Various embodiments of the present application obtain only a subset of the advantages set forth. No one advantage is critical to the embodiments.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein:

FIG. 1 is a partial sectional view of a semiconductor wafer including a via structure according to a first embodiment of the present invention;

FIG. 2 is a partial sectional view of a semiconductor wafer including a via structure according to a second embodiment of the present invention;

FIGS. 12A-12G show top views of areas of semiconductor according to the present invention with different shielding forms.

DETAILED DESCRIPTION OF THE PREFERRED EMBODIMENTS

Figure 3:
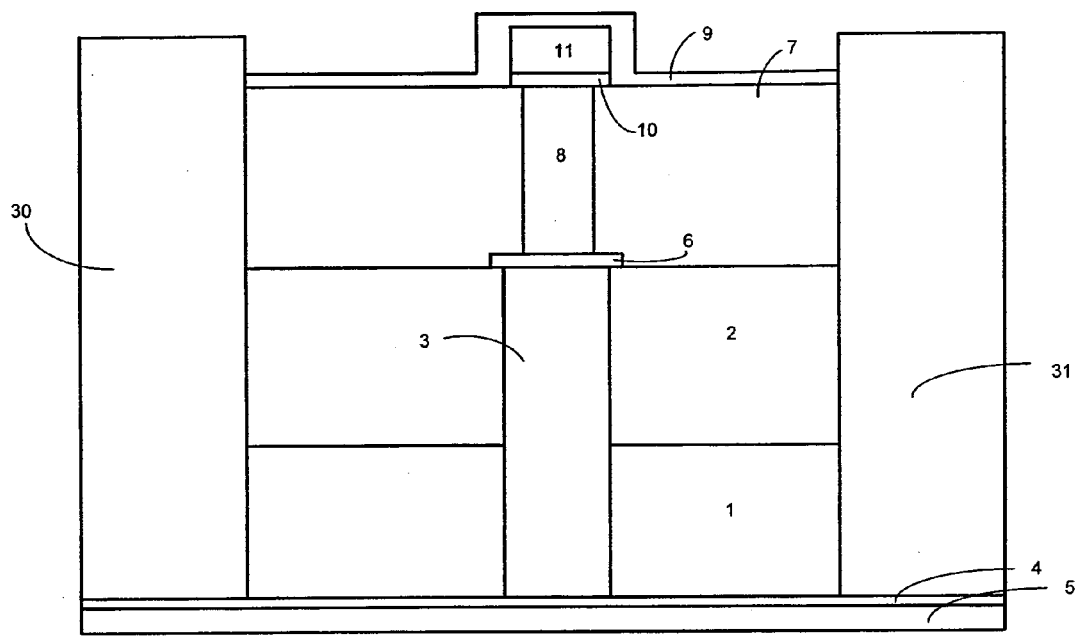
FIG. 3 is a partial sectional view of a first application of the embodiment as shown in FIG. 1 in a semiconductor device.

Turning to the drawings, exemplary embodiments of the present application will now be described wherein similar structures, regions and elements carry similar numerals. FIG. 1 depicts a partial sectional view of a semiconductor wafer, for example, for a power device, such as an integrated semiconductor device including a lightly doped drain MOS transistor (LDMOS). FIG. 1 shows a semiconductor substrate 1 which may include a p+ type substrate with a p– epitaxial layer as indicated by the dotted line and a backside metal layer 5 consisting, for example, of gold and an intermediate metal barrier layer 4. To provide different structures for the semiconductor device, a two layer oxide 2, 7 is provided on top of the substrate. Thus, on top of the substrate is a first oxide layer 2 and a second oxide layer 7 is deposited on top of this first oxide layer 2. On the surface of the thus formed semiconductor wafer, a metallization layer is provided. FIG. 1 shows, for example, a runner 11 which is deposited on the top surface of oxide layer 7. Between the oxide layer 7 and the runner 11 there is a metal barrier 10. To provide a coupling between such a runner 11 and the backside, a special via arrangement is used according to the present invention. Within the second oxide layer 7 a first tungsten via 8 extends from the top surface of the oxide layer 7 to the bottom surface of the oxide layer 7. A second copper via 3 extends underneath the first via 8 from the top surface of the first oxide layer 2 to the bottom surface of the substrate 1. The runner 11 can be made of gold, aluminum or any other suitable metal and the via 8 can be filled with tungsten, copper or any other suitable metal. Via 8 is usually designed to have a square footprint and via 3 to have a rectangular footprint. Furthermore, the footprint of via 3 can be larger than that of the via 8. Thus, a plurality of vias 8 can be placed on top of one via 3. However, a via 8 arranged on top of via 3 may also have an elongated rectangular shape forming a trench-like structure such as the underlying via and thereby providing a more complete shield. On top of the oxide layer 7, between the via 7 and the runner 11, a thin Titanium-Platinum layer is used as the metal barrier layer 10 if the runner 11 consists of gold. This barrier layer can be etched according to the shape of runner 11. This barrier layer improves the coupling between the runner 11 and the via 8 which consist of different metals, for example gold and tungsten, and, thus, its material depends on the material used for the runner 11 and via 7, respectively. The second via 3 can be filled with copper, tungsten or any other suitable metal. Again, a metal barrier layer 6 of suitable material is used between the two vias 3 and 8 as in this example, tungsten is used for via 8 and copper for via 3. Preferably, its footprint size is larger than that of the vias to avoid alignment problems. Similarly, the metal barrier 4 is chosen from material depending on the backside metal type and the material used to fill via 3. For example, using Au or AuSn for the backside layer requires Titanium-Platinum for the metal barrier 4. Thus, an efficient coupling between the runner 11 and the backside layer 5 can be provided.

If necessary, depending on the surrounding structure of the semiconductor, the vias 3 and 8 can be insulated using a thin insulation layer before filling the via with conductive metal. This is usually not necessary for vias within an oxide layer but rather for a via within the substrate such as via 3. On top of the resulting semiconductor structure, a passivation layer 9 is deposited in the usual manner. Such a via structure can provide not only the often necessary grounding with a backside metal layer but also electromagnetic and thermal shielding. In particular, the metal filled vias provide good electromagnetic shielding and will carry built up heat much better than the surrounding semiconductor material, thus, providing good thermal shielding as well.

Figure 4:
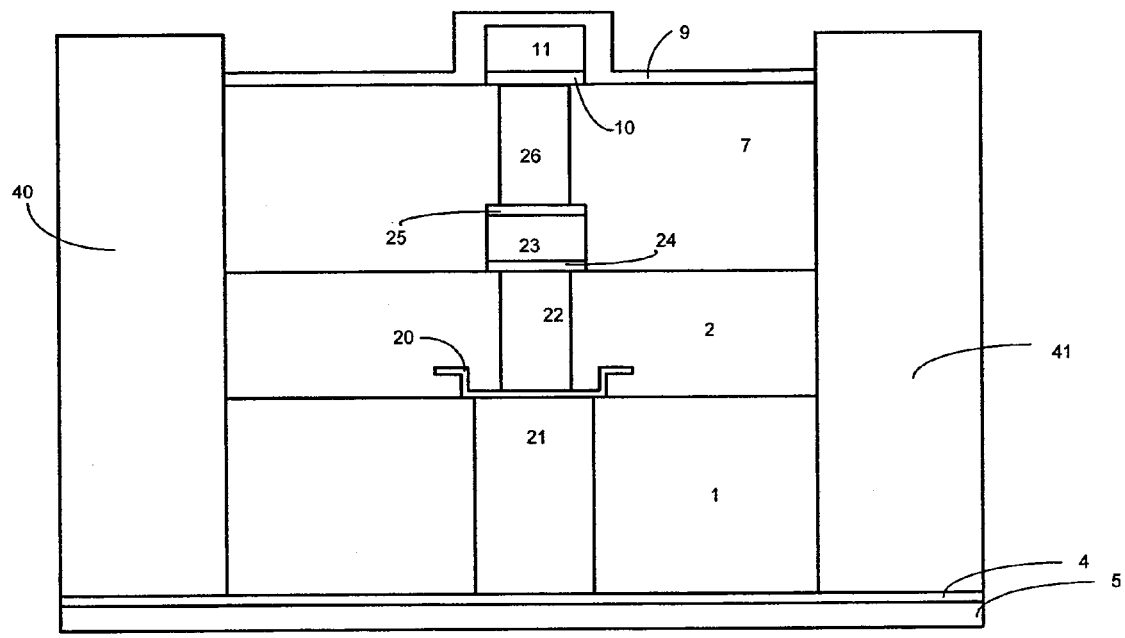
FIG. 4 is a partial sectional view of a second application of the embodiment as shown in FIG. 2 in a semiconductor device.

FIG. 2A shows a second embodiment of a via structure including two metallization layers. However, similar elements and regions carry similar numerals According to FIG. 2A two metal runners 11 and 23, made of gold or aluminum or any other suitable metal, are arranged in two layers above each other. The first runner 23 usually consists of Aluminum and is arranged on top of oxide layer 2 whereas the second runner 11 usually consists of gold and is arranged on top of oxide layer 7. Between the two runners 23 and 11 within the second oxide layer 7 a via 26 is arranged to couple first and second runner 23 and 11. To this end, there are metal barrier layer 10 and 25 deposited between the runners 12, 11 and the via 26, respectively. Again, the via 26 can be filled with tungsten or copper or any other suitable metal. The metal barrier layer can be made of Titanium-Platinum or any other suitable material to provide proper electrical and thermal coupling of the via and the respective runners as explained above. For example, metal barrier layers 24 and 25 consist of Titanium-Titanium-nitride and metal barrier 10 consists of Titanium Platinum if runner 11 consists of gold and runner 23 consists of Aluminum. The coupling between the first runner 23 and the backside metal layer 5 is provided by a second tungsten via 22 extending within the first oxide layer 2 and a third copper via 21 extending within the substrate 1 as shown in FIG. 4. Both vias 22 and 21 thereby reach from the respective top surface to the bottom surface of the layer 2 or 1, respectively. In-between the second and third vias 22 and 21, another metal barrier layer can be arranged. This metal barrier layer may have the same form as metal barrier layer 6 in FIG. 1. However, as shown in FIG. 2A, the metal barrier layer may have a cross-sectional profile of a saucer whereby the side walls of the saucer are spaced apart from the side walls of the via 22. Alternatively, as shown in FIG. 2B, the side walls can completely surround the via 22. Similar as in the embodiment shown in FIG. 1, a metal barrier layer 4, for example consisting of Titanium Platinum, is provided in between the backside metal layer 5 made of gold or an alloy such as AuSn or any other suitable material.

FIG. 3 shows a first application using a via structure as shown in FIG. 1 according to the present invention. The via structure 3, 6, 8 is placed to couple runner 11 with the backside layer 5 as shown in FIG. 1. However, the via structure is also placed in between a first transistor stage 30 and a second transistor stage 31 which are merely shown as schematic blocks for a better overview. The two transistor blocks 30, 31 can include a single transistor or an integrated stage with a plurality of transistor devices including other active or passive devices as known in the semiconductor art. In this particular example, transistor stage 30 is a low power input stage and, thus, can be designated as a "cool" stage. On the contrary, transistor stage 31 is a high power output stage and, thus, can be designated as a "hot" stage. The via structure 3, 6, 8 is placed in between these "cool" and "hot" stages to not only provide a proper grounding of runner 11 but also to provide electromagnetic and thermal de-coupling of the two stages. Other runners and structures can be provided within or on top of each layer 1, 2, 7 on either side of the via structure 3, 6, 8 depending on the specific design of the respective semiconductor device.

FIG. 4 shows a similar arrangement as shown in FIG. 3. In this second application again two transistor stages 40 and 41, such as an input and an output stage, are provided. However, in between the first stage 40 and the second stage 41 the via structure 21, 20, 22, 24, 23, 25, 26 according to the second embodiment as shown in FIG. 2 is used for electromagnetic and thermal de-coupling.

Figure 5:
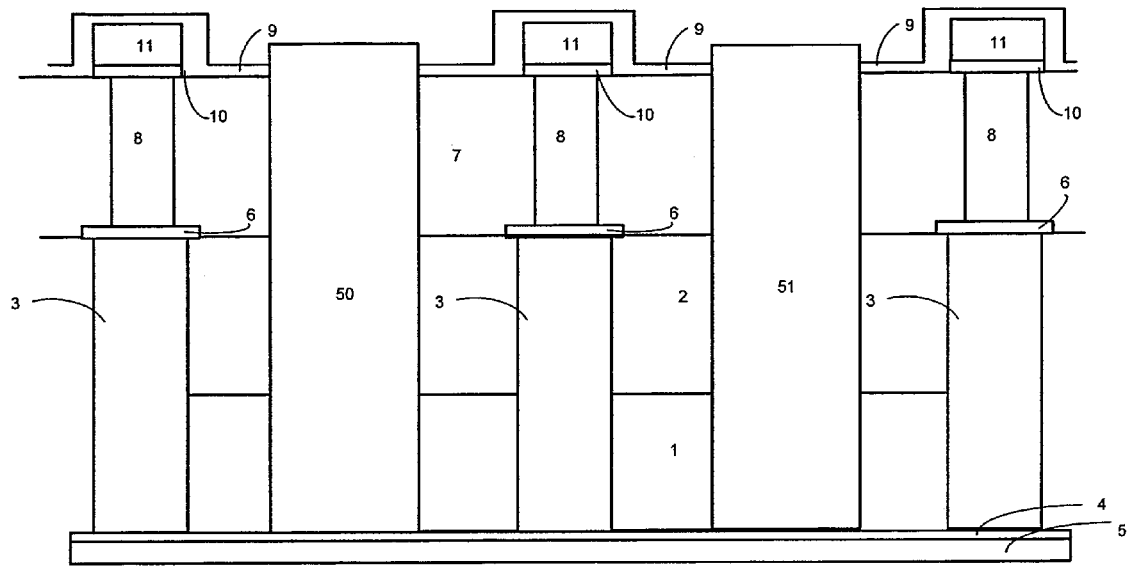
FIG. 5 is a partial sectional view of a third application of the embodiment as shown in FIG. 1 in a semiconductor device.
Figure 6:
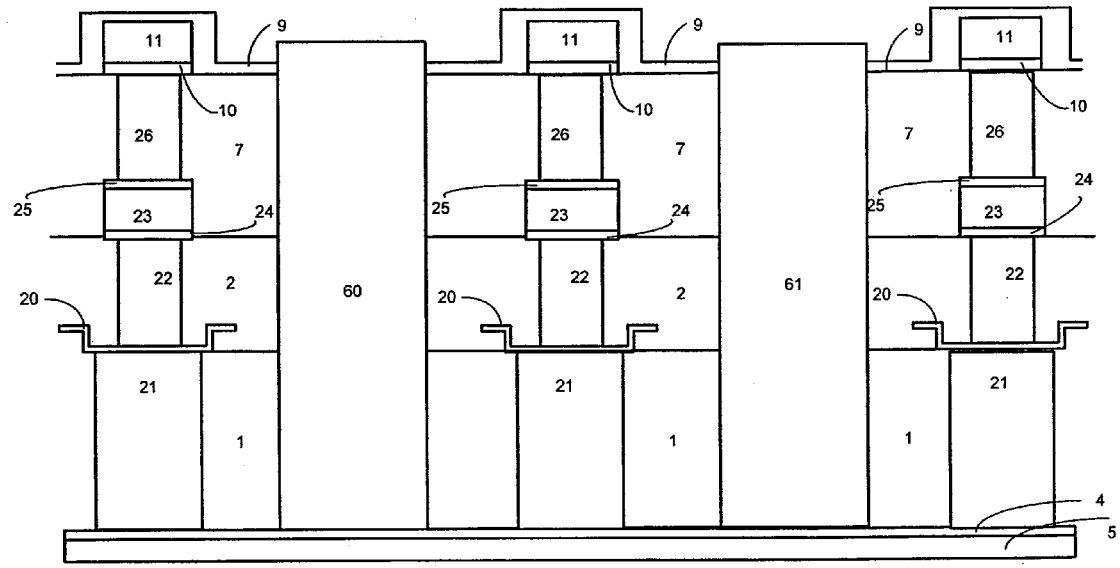
FIG. 6 is a partial sectional view of a fourth application of the embodiment as shown in FIG. 2 in a semiconductor device.

FIGS. 5 and 6 show two more applications, similar to the first and second application as shown in FIGS. 3 and 4. The first and second stages are here designated with numerals 50, 51 and 60, 61, respectively. In both applications, two more via structures 3, 6, 8 or 21, 20, 22, 24, 23, 25, 26 are used to provide complete or partial shielding of the respective stages 50, 51 and 60, 61 depending on their shape. The via structures 3, 6, 8 or 21, 20, 22, 24, 23, 25, 26 can, thus, be arranged on either sides as shown in the sectional views or they can be additionally connected in a third plane (not shown) to form, for example an open structure such as an U or a complete circle surrounding the respective stage. The via structures can further be extended to form a grid completely surrounding multiple stages to provide complete shielding in particular for sensitive stages within a semiconductor circuit. Thus, a plurality of these via structures can be placed to completely or partially surround sensitive structures.

Figure 7:
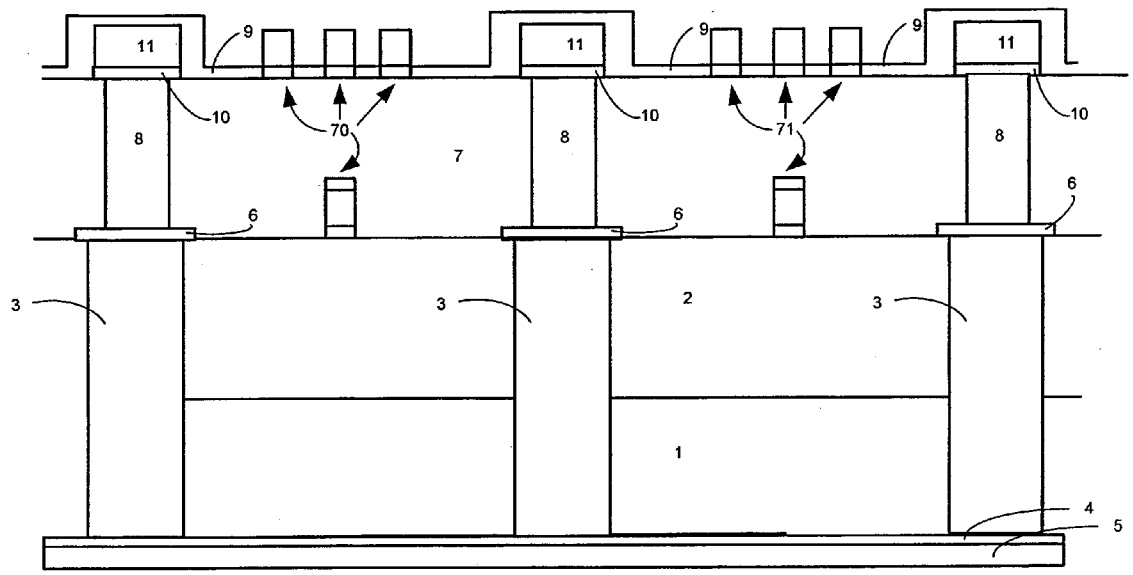
FIG. 7 is a partial sectional view of a fifth application of the embodiment as shown in FIG. 1 in a semiconductor device.
Figure 8:
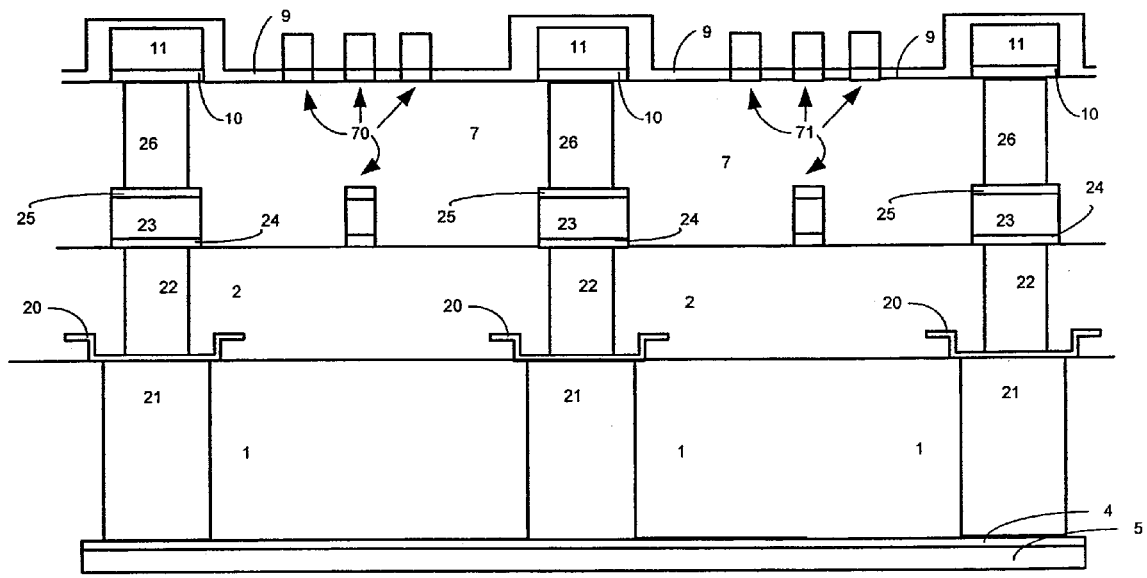
FIG. 8 is a partial sectional view of a sixth application of the embodiment as shown in FIG. 2 in a semiconductor device.

FIGS. 7 and 8 show further applications in which, for example, passive devices such as capacitors or coils, can be shielded in a similar manner. Instead of an active transistor stage, FIGS. 7 and 8 show, for example, a passive coil 70, 71 formed by a two metal layer process steps on top of the first and second oxide layer 2 and 7, respectively. A cut through such a formed coil within a semiconductor wafer is shown in FIGS. 7 and 8. Such a coil can have multiple windings in all three dimensions even though FIGS. 7 and 8 only show a single winding for a better overview. Other passive elements such as resistors, capacitors, etc. can be shielded if necessary in a similar manner.

Figure 9:
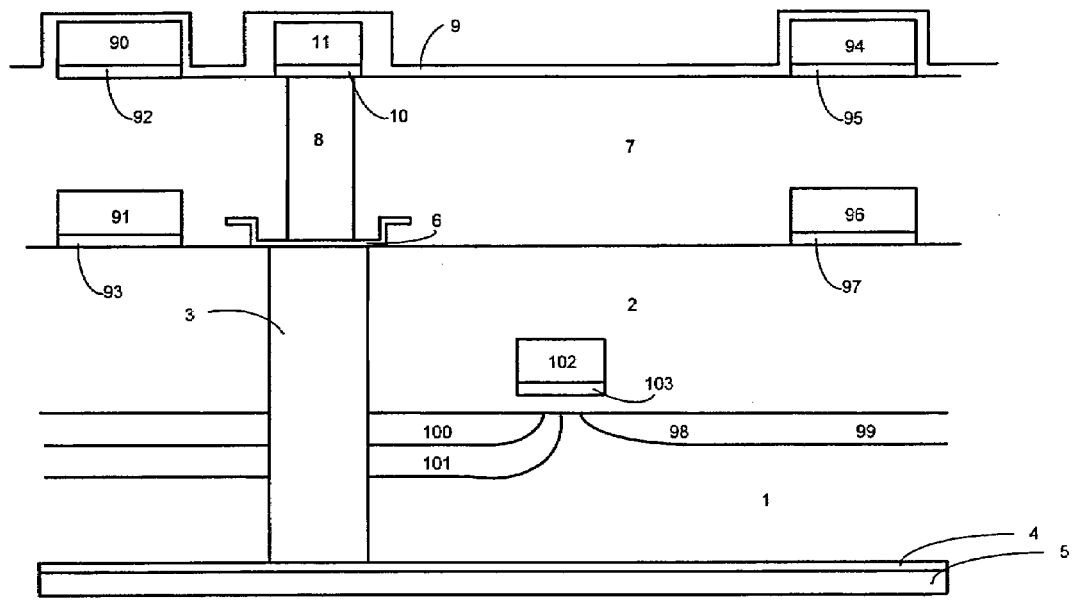
FIG. 9 is a partial sectional view of a seventh application of the embodiment as shown in FIG. 1 in a power semiconductor.
Figure 10:
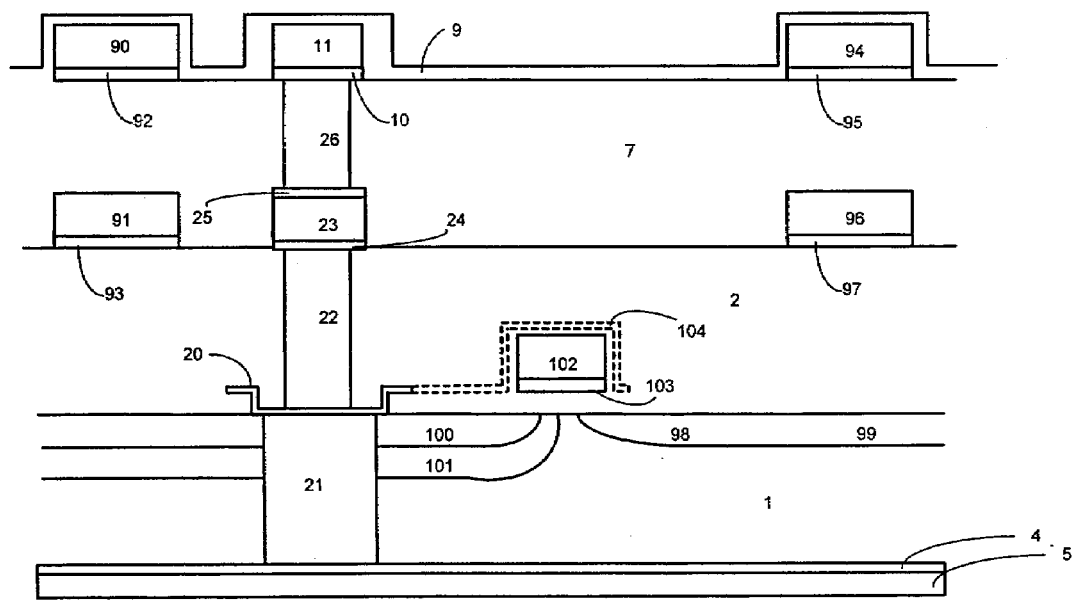
FIGS. 10, 10a are partial sectional views of an eighth application of the embodiment as shown in FIG. 2 in a power semiconductor.

FIGS. 9 and 10 show an effective shielding within a single transistor, such as a lightly doped drain field effect (LD-MOS) transistor. The via structures 3, 6, 8 or 21, 20, 22, 24, 23, 25, 26 are here placed between the gate runner 90 or 91 and the gate to provide effective shielding of the gate and drain runners. The transistor shown in FIGS. 9 and 10 comprises a substrate for example a p− substrate. Optionally, a p+ substrate and p− epitaxial layer structure can be provided as known in the prior art. A field effect transistor is formed by a first lightly doped n− drain area 98 and are more heavily doped n+ drain area 99 which extend laterally under the top surface of the substrate 1. Above this drain area are two drain runners 96 and 94 each deposited on the surface of the first and second oxide layer 2 and 7, respectively. Between the runners 94 and 96 and the respective oxide layer 2 and 7 are metal barrier layers 97 and 95 shaped in the form of the respective runners 96 and 94. The connection between the drain runners 94 and 96 and the drain area 99 is not shown in FIGS. 9 and 10 and can be placed at different locations depending on the design of the semiconductor device.

Figure 10A:
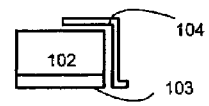

On the other side of the semiconductor device, a heavily n+ doped source region extends under the top surface of the substrate layer 1 in such a way that a channel is created which is covered by a gate arranged within the oxide layer 2 consisting of a metal barrier layer 103 and the polysilicon or silicide layer 102. The source region 100 can further be surrounded by a p doped well 101 as shown in FIGS. 9 and 10. The via structures 3, 6, 8 or 21, 20, 22, 24, 23, 25, 26 are used to provide a single source runner 11 or source runners 23 and 11 and are arranged above the source region 100 on top of oxide layer 2 and 7, respectively. The via 8 or vias 22, 26 provide for a coupling of the source runner 11 or source runners 11 and 23 with the source region 100. To this end the saucer shaped barrier metal layer 6 or 20 provide for the coupling of the source region 100 with the via 8 or 22 arranged above the source region 100. Vias 3 or 21 provide for a proper grounding of the source region by coupling the source region 100 and the runners 11, 23 via the metal barrier layer 4 with the backside metal layer 5. Thus, a direct connection between the source runners 11 and 23 and the backside metal layer 5 is provided. The barrier metal 20 in FIG. 10 can furthermore be extended to cover the gate 102/103 creating a field plate 104 as indicated in FIG. 10 by the dotted lines. Thus, an even more effective shielding of the gate can be accomplished. FIG. 10a shows another embodiment which indicates that the extended field plate 104 must not be coupled with the barrier metal 20 at all locations. The coupling between the field plate 104 and the barrier metal can be established at a single or multiple location. However, a sectional view at locations where they are not connected would result in the sectional view as shown in FIG. 10a. At such locations, the gate would be still partially covered by the field plate 104.

The backside of the substrate 1 is covered with a first thin barrier layer 4 consisting for example of Titanium-Platinum and a gold metal layer 5. The major part of the vias 8, 22, and 26 are filled with tungsten and vias 3 with copper to provide a direct and permanent grounding of the source runners 11 and 23. Again, the thin layer 4 is used to provide a coupling between a backside layer 5 made of gold and the copper filled substrate via 3 or 21. In case different metals are used for filling the substrate via or for the backside layer, different materials for the metal barrier layer 4 might apply.

Two gate runners 90, 91 are arranged on the top surface of oxide layers 2 and 7, respectively. To provide efficient electromagnetic shielding, the via structures 3, 6, 8, 11 or 21, 20, 22, 24, 23, 25, 26, 11 which include the source runners 11 and 23 are placed in between the gate runners 90, 91 and the drain runners 94, 96. Thus, gate runners 90, 91 are located outside the area defined be the drain and source runners 11, 23 94, 96 on the left side of the source runner 11, 23. The gate runner 20 can be coupled with the gate at a single area (not shown in FIGS. 9 and 10) depending on the structure of the transistor. Thus, the via structure including the source runner 11, 23 effectively shields the gate runners 90, 91 from the drain runners 94, 96. The drain, source, and gate runners 94, 96, 23, 11, 90, and 91 can be made of appropriate metal such as gold or aluminum. In both FIGS. 9 and 10 a double metal layer structure is shown, thus, providing for the possibility of two runners for drain, source and gate. However, the present invention also applies for a semiconductor device which provides for single runners using a single metal layer concept.

Figure 11A:
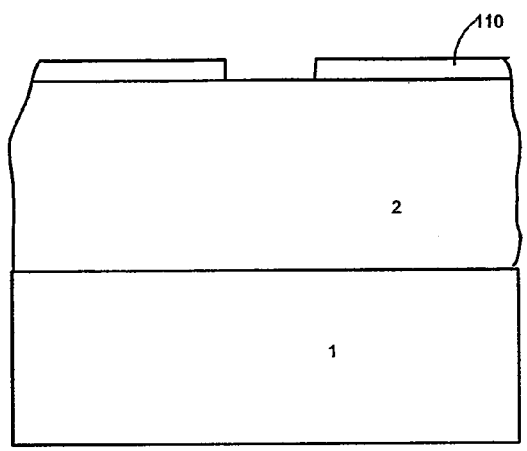
FIGS. 11A-11I show different exemplary manufacturing steps for manufacture of a via structure according to the present invention.
Figure 11B:
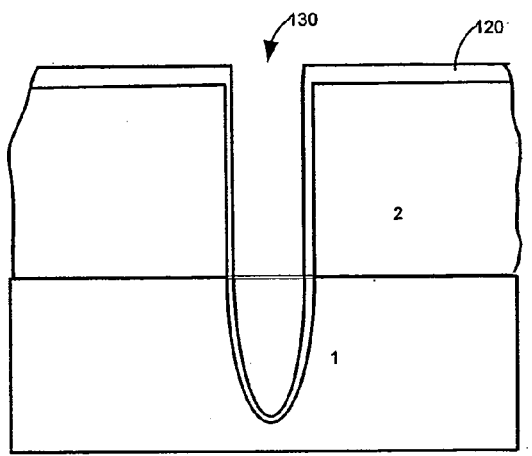
Figure 11C:
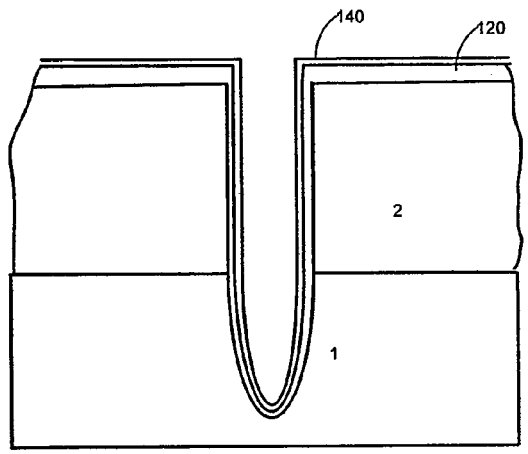
Figure 11D:
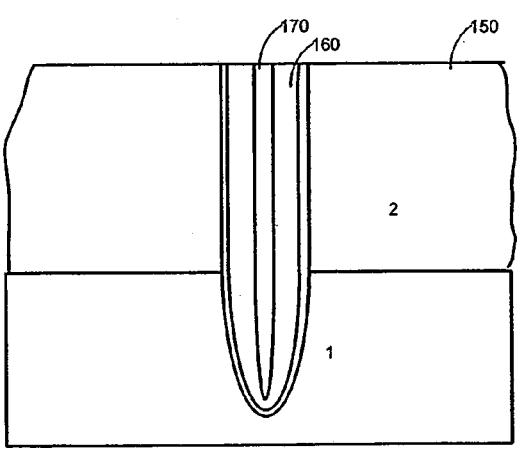

FIGS. 11A-11I show different steps in the manufacturing process to create a via for coupling a runner with the backside metal layer as for example shown in FIGS. 1, 3, 5, 7, and 9. FIG. 11A shows the relevant portion of a wafer with substrate 1 and first oxide layer 2 after the dielectric planarization process. At this time a hard mask 110, for example, silicon nitride is used to form mask including at least one window 111 through which a via 130 can be etched. FIG. 11B shows the via 130 after the etching which extends deep into the substrate 1. Optionally, dielectric isolation layers 120 of undoped silicon glass and silicon nitride can be subsequently deposited, in particular within the via to cover the via side walls, as shown in FIG. 11B. However, if contact to a specific area, for example, the source region of a transistor as shown in FIGS. 9 and 10 is necessary, no insulation layers will be deposited in the via. Thus, depending on where the via is placed and depending on its function an insulation layer can be used to isolate the via from the surrounding area or no insulation layer is used to couple the surrounding area with the via. FIG. 11C shows another layer 140 on top of layer 120 or a single layer directly deposited after etching of the via which can be obtained through Titanium/Titanium nitride sputter and anneal processes. FIGS. 11D to 11I show the layers previously deposited as a single layer 190 for a better overview or the single Titanium/Titanium nitride layer (now designated with numeral 1140). In a next step, Tungsten 160 is deposited into the substrate via followed by a Tantalum/Tantalum nitride/Copper seed layer. A copper deposition 170 then follows to fill the substrate via. The surface is then planarized by a chemical mechanical polishing process as shown in FIG. 11D.

Figure 11E:
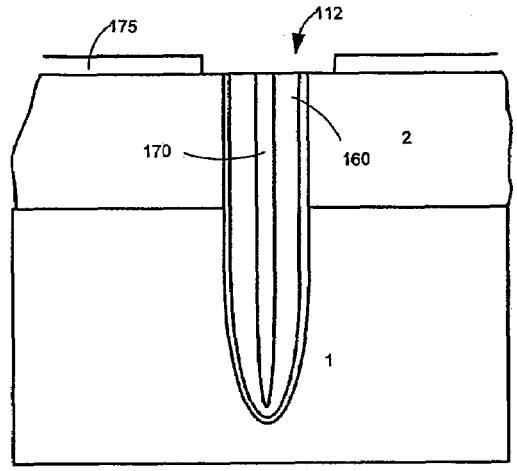
Figure 11F:
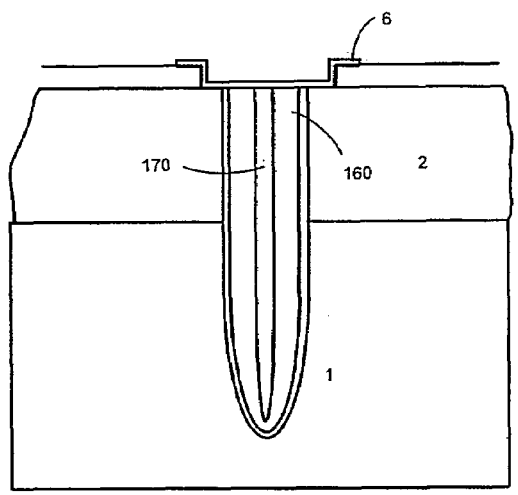
Figure 11G:
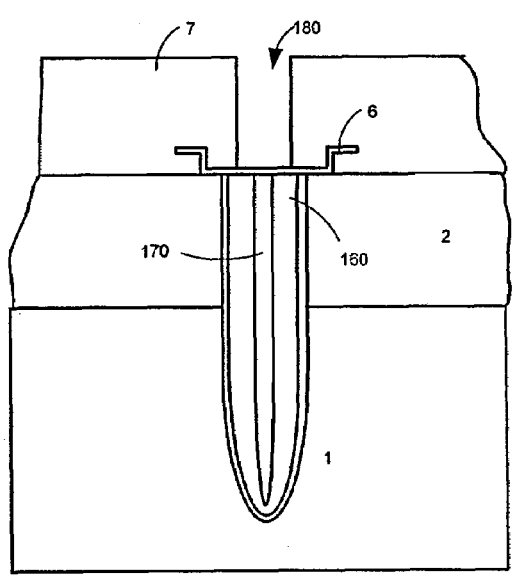
Figure 11H:
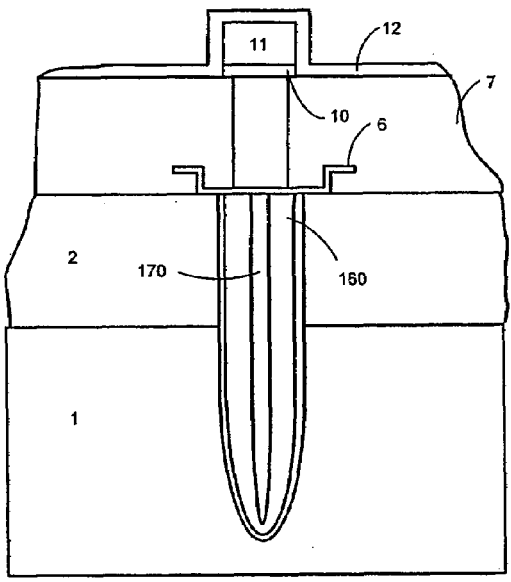

In FIG. 11E, a masking layer 175 is deposited on top of the oxide layer 2. Using the appropriate photo etching technology, windows 112 are created in which thin layers of Titanium-Titaniumnitride 6 are deposited to form barrier metal layer 6 as shown in FIG. 11F. These layers 6 may have a flat cross-sectional profile as shown in FIG. 1 or a cross sectional profile of a saucer as for example shown in FIG. 2 or 9. Next, as shown in FIG. 11G, another oxide layer is deposited to create the second oxide layer 7 after the necessary structures within the second oxide layer have been created, for example, metal runners 91 and 96. The coupling of the barrier metal layer 6 with the respective runner is created as follows. Again, as shown in FIG. 11G, photo etching technology is used to create a respective via 180. This via 180 is then filled with tungsten as shown in FIG. 11H. On top of the tungsten via 8 a Titanium-Platinum layer forming the barrier metal 10 can be deposited and etched. This additional layer provides a coupling between the tungsten via 8 and the following gold or aluminum runners 11. Finally, a passivation layer 12 is deposited to cover the metal runners and the oxide layer. These steps can be easily integrated into known manufacturing processes. Thus, a stacked via structure can be created. the manufacturing process for the embodiment as shown in FIGS. 2, 4, 6, 8, and 10 can be accomplished in a similar manner. The filling of the different vias can vary. As shown in steps 11B-11D a layered filling can be used or a filling with a single material such as tungsten or copper can be used.

Figure 11I:
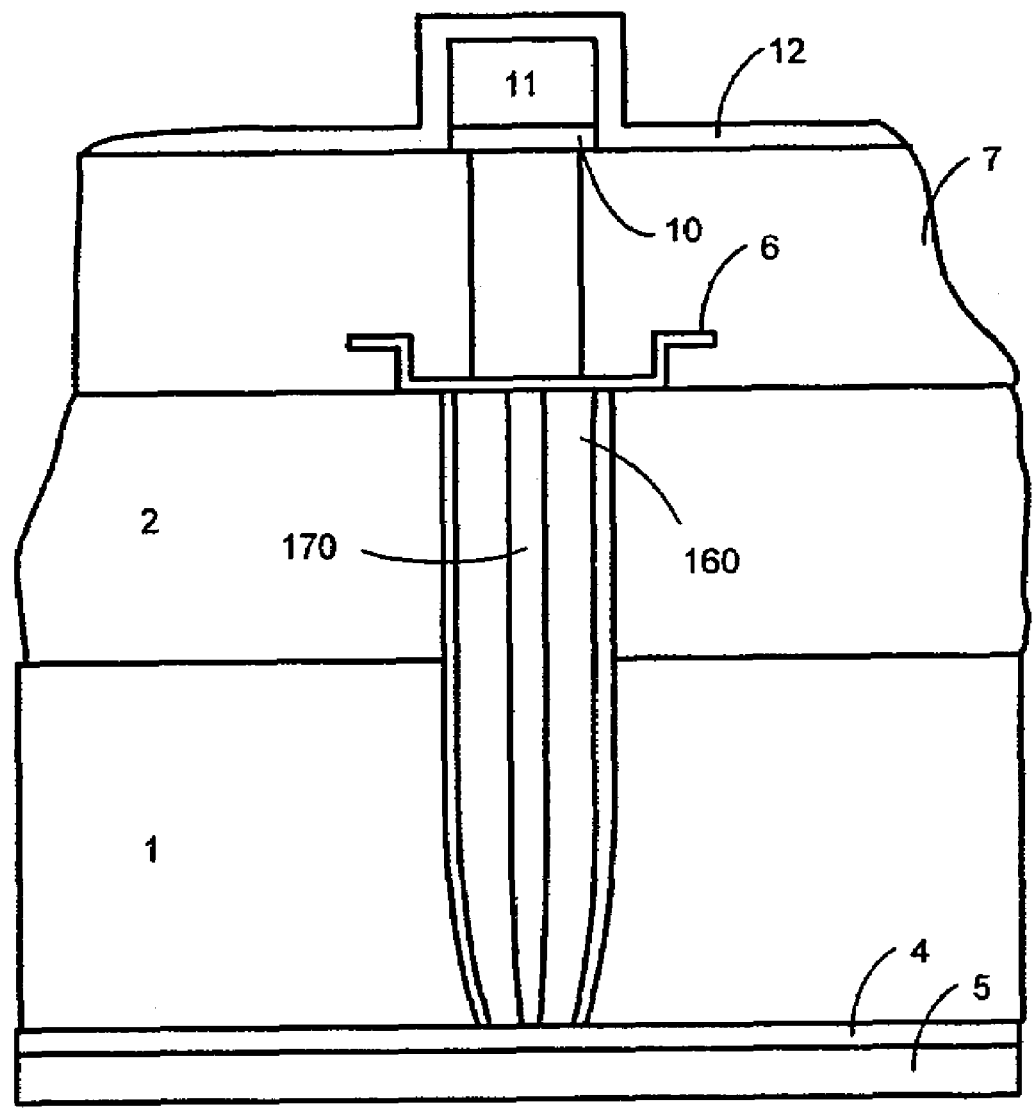

FIG. 11I shows the final structure after backside grinding, backside damage etch, backside copper CMP, deposition of the barrier metal layer 4, for example of titanium platinum, and deposition of backside metal layer 5 (gold or gold tin) to complete the front to back via structure.

FIG. 12A-12F shows different possible arrangements of the shielding via structures using a top view of a semiconductor according to the present invention. Again a specific semiconductor device is schematically shown in all figures as a block 30, 31 and may be a transistor stage a passive component, or a combination of active and passive components. For a better overview only specific parts of the via structures, such as substrate vias 3, 21, vias 8, 26, and runners 11, are shown in FIGS. 12A-F. In FIG. 12A the via structure shown from the top with runner 11 is extended to partially surround block 31, thus, shielding for example, the devices in block 31 from the devices in block 30. The U-form allows for electrical connection of block 31 through additional metal runners (not shown). The shielding via structure comprises three rectangular substrate vias 3, 21 arranged on three sides of block 31. However, a single elongated substrate via 3, 21 can also be provided. The runner 11 has also a similar U-shape and is arranged on top of the substrate via 3, 21. To couple substrate via 3, 21 and the runner 11, a plurality (in this embodiment six vias 8, 26) of vias 8, 26 having a square footprint is provided. However, a single elongated having a rectangular footprint can also be used. In embodiments having two metal layers, of course additional vias 22 (not shown in FIG. 12A-E) are provided to couple the substrate via 21 with the top via 26. However, these vias can also be implemented having an elongated footprint such as via 21 creating a more trench-like structure. FIG. 12B shows another embodiment in which both blocks 30 and 31 are partially surrounded by the via structure with runner 11 having a H-form. Here 5 substrate vias having an elongated rectangular footprint are placed on respective three sides of each block 30, 31. Again, a plurality of vias 8, 26 is provided to connect each substrate via 3, 21 with the runner 11.

FIG. 12C shows another embodiment with two elongated blocks 30, 31. The separating substrate via 3, 21 and the runner 11 are also elongated here and a respective plurality of vias 8, 26 couples the runner 11 with the substrate via 3, 21. In addition, if necessary electrically couplings between the two blocks 30, 31 can be provided by additional metal runners 34, 35 indicated by dotted runners that are arranged around the via structure. These couplings can be in the same layer as the top runners. FIG. 12D shows another embodiment with two elongated blocks 30, 31. Here two substrate vias 3, 21 having a rectangular footprint, metal runners 11, and coupling vias 8, 26 are placed next to each other for shielding purposes. However, these two structures provide for a gap in between them. A metal runner 33 can be provided to run through this gap to electrically couple blocks 30, 31. The gap can be as wide as necessary to provide for a single or multiple runners. Also, the coupling 33 can be in a different layer than the top runners.

FIG. 12E to 12G show embodiments which comprises a complete shielding of one or more blocks. FIGS. 12E and G do not show the vias for a better overview. In FIG. 12E a single block 31 is completely surrounded by a runner 11. The underlying via structures can also completely surround the block 31. However, in particular in case of two metal layers, the intermediate metal layer can have openings to provide for electrical connections. FIG. 12F shows a top view of a section of a via structure according to the present invention that can completely surround a block but still provides for electrical connection through the intermediate metal layer. To this end, FIG. 12F shows a section of the via structure as indicated in FIG. 12E by the dotted line. On top of this substrate via 21, an intermediate metal runner 23 provides for a gap 127 through which another intermediate metal runner 125 can be arranged to connect otherwise shielded blocks. The dotted lines indicate the continuously overlaying metal runner 11. The vias 22, 26 are arranged in equal distances except for the gap 127 where respective vias 22, 26 are omitted. Alternatively, to provide electrical connection, block 31 may comprise pads 122, 123, 124 for bonding the device with external and/or internal pads as indicated in FIG. 12E. A similar method can of course also be applied to the top metal layer. In such a case, the intermediate metal runner can provide for a continuous shielding and the top metal runner 11 provides for a respective gap. Finally, FIG. 12G shows another embodiment in which the via structure is extended to form a grid including a plurality of cells 120, 121. Within each cell 120, 121 different devices or elements can be formed. Thus, the cells 120, 121 may have different sizes and shapes depending on the respective area needed for the respective device. The electrical coupling methods described above can also be applied to such a structure.

What is claimed is:

1. A semiconductor device comprising:
    a semiconductor substrate having a top and a bottom surface,
    first and second insulating layers deposited on the top surface of said substrate,
    a first runner arranged on top of the first insulator layer,
    a second runner arranged on top of the second insulator layer above said first runner,
    a backside metal layer deposited on the bottom surface of the substrate,
    a first via structure extending from the bottom surface of the substrate to the top surface of the substrate between the backside layer and the first runner,
    a second via structure extending from the top surface of the substrate to the top of the first insulating layer between the first via and the first runner,
    a third via structure extending from the top of the first insulating layer to the top of the second insulating layer between the first runner and the second runner, and
    barrier metal layers arranged between the first and second via vias, between the first runner and the second via, between the first runner and the third via, between the third via and the second runner and between the first via and the backside metal layer.

2. The semiconductor device as claimed in claim 1, wherein the second and third vias have a smaller footprint than the first via and a plurality of second and third vias are arranged between the first via and the runners.

3. The Semiconductor device as claimed in claim 1, wherein said barrier metal layer between the first and second vias has a cross-sectional profile of a saucer.

4. The Semiconductor device as claimed in claim 3, wherein the bottom barrier metal layer comprises side walls that enclose said via.

5. The Semiconductor device as claimed in claim 3, wherein the barrier metal layer between the first via and the second via comprises side walls that are spaced apart from said via.

6. The Semiconductor device as claimed in claim 1, wherein the barrier metal layers between the first via and the second via, between the first runner and the second via, and between the third via and the first runner consist of Titanium-Titanium nitride.

7. The Semiconductor device as claimed in claim 1, wherein the barrier metal layers between the second runner and the third via and between the backside layer and the first via consist of Titanium-Platinum.

8. The Semiconductor device as claimed in claim 1, wherein the second and third vias are filled with tungsten.

9. The Semiconductor device as claimed in claim 1, wherein the first via is filled with Tungsten or copper.

10. The Semiconductor device as claimed in claim 1, wherein the substrate comprises a p+ substrate and p-epitaxial layer.

11. The Semiconductor device as claimed in claim 1, wherein first, second and third via structures are arranged between a first and second stage of an integrated device for electromagnetic and/or thermal de-coupling.

12. The Semiconductor device as claimed in claim 11, wherein the first stage is an input transistor stage and the second stage is a power transistor output stage.

13. The Semiconductor device as claimed in claim 2, wherein the first via structure is extended in such a way that it at least partly surrounds a device formed within said semiconductor device for electromagnetic and/or thermal de-coupling.

14. The Semiconductor device as claimed in claim 13, wherein the first via structure is extended in such a way that it at least completely surround said device.

15. The Semiconductor device as claimed in claim 13, wherein the first, second and third via structures are extended to form a grid including cells in which certain semiconductor devices are formed.

16. The Semiconductor device as claimed in claim 13, wherein said device includes an active semiconductor structure.

17. The Semiconductor device as claimed in claim 13, wherein said device includes a passive semiconductor structure.

18. The Semiconductor device as claimed in claim 13, wherein the first device is shielded from a second device and the first device is coupled with the second device through at least one electrical coupling.

19. The Semiconductor device as claimed in claim 18, wherein the second and/or third via structures comprise an opening for providing a passageway for the electrical coupling.

20. The Semiconductor device as claimed in claim 19, wherein the electrical coupling is arranged in a first or second metal layer.

21. A semiconductor device comprising:
    a semiconductor substrate having a top and a bottom surface,
    first and second insulating layers deposited on the top surface of said substrate,
    a first runner arranged on top of the first insulator layer,
    a second runner arranged on top of the second insulator layer above said first runner,
    a backside metal layer deposited on the bottom surface of the substrate,
    a first via structure extending from the bottom surface of the substrate to the top surface of the substrate between the backside layer and the first runner,
    a second via structure extending from the top surface of the substrate to the top of the first insulating layer between the first via and the first runner, and
    a third via structure extending from the top of the first insulating layer to the top of the second insulating layer between the first runner and the second runner, wherein the first, second and third via structures are arranged within a field effect transistor structure having a source region, a drain region and a gate, in such a way that the first via couples the source region with the backside layer.

22. The Semiconductor device as claimed in claim 21, further comprising at least one drain runner arranged on top of the first and/or second oxide layer above said drain region and on one side of the first and second via structures, and at least one gate runner arranged on top of the first and/or second oxide layer on the other side of the first, second and third via structures.

23. The semiconductor device as claimed in claim 21, further comprising barrier metal layers arranged between the first and second vias, between the first runner and the second via, between the first runner and the third via, between the third via and the second runner and between the first via and the backside metal layer.

24. The semiconductor device as claimed in claim 21, wherein the second and third vias have a smaller footprint than the first via and a plurality of second and third vias are arranged between the first via and the runners.

25. The Semiconductor device as claimed in claim 23, wherein said barrier metal layer between the first and second vias has a cross-sectional profile of a saucer.

26. The Semiconductor device as claimed in claim 25, wherein the bottom barrier metal layer comprises side walls that enclose said via.

27. The Semiconductor device as claimed in claim 25, wherein the barrier metal layer between the first via and the second via comprises side walls that are spaced apart from said via.

28. The Semiconductor device as claimed in claim 23, wherein the barrier metal layers between the first via and the second via, between the first runner and the second via, and between the third via and the first runner consist of Titanium-Titanium nitride.

29. The Semiconductor device as claimed in claim 23, wherein the barrier metal layers between the second runner and the third via and between the backside layer and the first via consist of Titanium-Platinum.

30. The Semiconductor device as claimed in claim 21, wherein the second and third vias are filled with tungsten.

31. The Semiconductor device as claimed in claim 21, wherein the first via is filled with Tungsten or copper.

32. The Semiconductor device as claimed in claim 21, wherein the substrate comprises a p+ substrate and p− epitaxial layer.

33. The Semiconductor device as claimed in claim 21, wherein first, second and third via structures are arranged between a first and second stage of an integrated device for electromagnetic and/or thermal de-coupling.

34. The Semiconductor device as claimed in claim 33, wherein the first stage is an input transistor stage and the second stage is a power transistor output stage.

35. The Semiconductor device as claimed in claim 24, wherein the first via structure is extended in such a way that it at least partly surrounds a device formed within said semiconductor device for electromagnetic and/or thermal de-coupling.

36. The Semiconductor device as claimed in claim 35, wherein the first via structure is extended in such a way that it at least completely surround said device.

37. The Semiconductor device as claimed in claim 35, wherein the first, second and third via structures are extended to form a grid including cells in which certain semiconductor devices are formed.

38. The Semiconductor device as claimed in claim 35, wherein said device includes an active semiconductor structure.

39. The Semiconductor device as claimed in claim 35, wherein said device includes a passive semiconductor structure.

40. The Semiconductor device as claimed in claim 35, wherein the first device is shielded from a second device and the first device is coupled with the second device through at least one electrical coupling.

41. The Semiconductor device as claimed in claim 40, wherein the second and/or third via structures comprise an opening for providing a passageway for the electrical coupling.

42. The Semiconductor device as claimed in claim 41, wherein the electrical coupling is arranged in a first or second metal layer.

* * * * *